(12) United States Patent
Shibata et al.

(10) Patent No.: US 9,110,237 B2
(45) Date of Patent: Aug. 18, 2015

(54) METHOD OF MANUFACTURING OPTICAL WAVEGUIDE

(75) Inventors: Naoki Shibata, Ibaraki (JP); Ryusuke Naito, Ibaraki (JP); Toru Mizutani, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 92 days.

(21) Appl. No.: 13/311,938

(22) Filed: Dec. 6, 2011

(65) Prior Publication Data

US 2012/0164313 A1    Jun. 28, 2012

(30) Foreign Application Priority Data

Dec. 22, 2010  (JP) ................. 2010-285791

(51) Int. Cl.
*G02B 6/132* (2006.01)
*G03F 9/00* (2006.01)

(52) U.S. Cl.
CPC .............. *G02B 6/132* (2013.01); *G03F 9/7042* (2013.01)

(58) Field of Classification Search
CPC .......... G02B 6/13; G02B 6/131; G02B 6/132; G02B 6/134; G02B 6/1342; G02B 6/1347; G02B 6/136; G02B 6/138; G03F 9/7042
USPC ..................................... 427/163.2
See application file for complete search history.

(56) References Cited

U.S. PATENT DOCUMENTS

| | | | |
|---|---|---|---|
| 6,403,407 B1 | 6/2002 | Andry et al. | |
| 6,773,870 B2 | 8/2004 | Lai et al. | |
| 2002/0074308 A1* | 6/2002 | Beguin | 216/2 |
| 2003/0180628 A1 | 9/2003 | Lai et al. | |
| 2005/0118515 A1* | 6/2005 | Progler et al. | 430/5 |

(Continued)

FOREIGN PATENT DOCUMENTS

| | | |
|---|---|---|
| CN | 1327261 A | 12/2001 |
| CN | 1764516 A | 4/2006 |

(Continued)

OTHER PUBLICATIONS

Japanese Office Action dated Mar. 12, 2013, issued in corresponding Japanese Patent Application No. 2010-285791, w/ English translation.

(Continued)

*Primary Examiner* — James M Mellott
(74) *Attorney, Agent, or Firm* — Westerman, Hattori, Daniels & Adrian, LLP

(57) ABSTRACT

A method of manufacturing an optical waveguide is provided which enables a recognition device such as a CCD camera to easily recognize an alignment mark for positioning a mold for over cladding layer formation. The method includes the steps of: forming protruding cores and a protruding alignment mark on an upper surface of an under cladding layer on a substrate by a photolithographic method; and forming the over cladding layer by use of the mold positioned using the alignment mark as a guide. For the formation of the alignment mark, a photomask is used which has an opening pattern for alignment mark formation including an opening, and a light transmission amount reduction region provided around the opening and having an aperture ratio within a range greater than 10% and less than 80%. The alignment mark is formed to have a peripheral side surface in the form of an inclined surface.

3 Claims, 6 Drawing Sheets

(56) References Cited

U.S. PATENT DOCUMENTS

| | | |
|---|---|---|
| 2005/0225693 A1 | 10/2005 | Kamijima |
| 2007/0031761 A1* | 2/2007 | Kohl et al. .................... 430/311 |
| 2008/0013903 A1* | 1/2008 | Fujii et al. .................... 385/123 |
| 2008/0198144 A1 | 8/2008 | Shimizu et al. |
| 2008/0277809 A1 | 11/2008 | Shimizu et al. |
| 2009/0140438 A1 | 6/2009 | Yamazaki et al. |
| 2009/0202737 A1* | 8/2009 | Shimizu ....................... 427/487 |
| 2009/0269704 A1 | 10/2009 | Hodono |
| 2010/0027937 A1 | 2/2010 | Juni |
| 2010/0129026 A1 | 5/2010 | Hodono |
| 2011/0262860 A1* | 10/2011 | Willson et al. ............. 430/270.1 |
| 2012/0002932 A1 | 1/2012 | Takenobu et al. |

FOREIGN PATENT DOCUMENTS

| | | |
|---|---|---|
| CN | 101122739 A | 2/2008 |
| CN | 101452906 A | 6/2009 |
| CN | 101533127 A | 9/2009 |
| JP | 2003-287608 A | 10/2003 |
| JP | 2007-210126 A | 8/2007 |
| JP | 2007210126 A * | 8/2007 |
| JP | 2008-76824 A | 4/2008 |
| JP | 2008-203431 A | 9/2008 |
| JP | 2008-281654 A | 11/2008 |
| JP | 2009-186834 A | 8/2009 |
| JP | 2009-265342 A | 11/2009 |
| JP | 2010-32378 A | 2/2010 |
| JP | 2010-97192 A | 4/2010 |
| JP | 2010-128200 A | 6/2010 |
| TW | 201040599 A | 11/2010 |

OTHER PUBLICATIONS

Japanese Office Action dated Nov. 5, 2013, corresponding to Japanese Application No. 2010-285791 w/English Translation. (6 pages).

Japanese Decision of Rejection of the Amendment dated Jul. 1, 2014, issued in Japanese Patent Application No. 2010-285791, w/English translation (6 pages).

Japanese Decision of Rejection dated Jul. 1, 2014, issued in Japanese Patent Application No. 2010-285791, w/ English translation (2 pages).

Chinese Office Action dated Jul. 3, 2014, issued in corresponding Chinese Application No. 201110411253.4; w/ English Translation (14 pages).

Office Action dated Jan. 26, 2015, issued in corresponding Taiwanese Application No. 100146469, w/English translation. (7 pages).

Chinese Office Action dated Mar. 20, 2015, issued in corresponding CN Patent Application No. 2011104112534 with English translation (16 pages).

* cited by examiner

RELATED ART

METHOD OF MANUFACTURING OPTICAL WAVEGUIDE

BACKGROUND

1. Field of the Invention

The present invention relates to a method of manufacturing an optical waveguide for widespread use in optical communications, optical information processing, position sensors, and other general optics.

2. Description of the Related Art

In general, an optical waveguide is configured in such a manner that cores serving as a passageway for light are formed in a predetermined protruding pattern on an upper surface of an under cladding layer, and that an over cladding layer is formed so as to cover the cores. For the production of such an optical waveguide, the under cladding layer, the cores and the over cladding layer which are made of photosensitive resin compositions and the like as materials thereof are generally formed in a stacked manner in the order named on a substrate of stainless steel foil and the like by a photolithographic method and the like.

When the optical waveguide is used as a touch position sensor for a touch panel, there are cases where a light-emitting section and a light-receiving section in the over cladding layer are formed in a lens-shaped configuration. A mold is used to form the over cladding layer in a specific shape in this manner.

An exemplary method of manufacturing an optical waveguide using the aforementioned mold is as follows. First, a mold including a cavity having a mold surface complementary in shape to the surface of an over cladding layer is prepared as the aforementioned mold. Then, an under cladding layer and cores are formed in the order named on a substrate. Thereafter, a photosensitive resin composition, for example, for the formation of the over cladding layer is applied to cover the cores. Using the aforementioned mold, the applied coating layer is pressed into the shape of the over cladding layer. In that state, part of the molded coating layer is hardened to form the over cladding layer. Such a technique is disclosed, for example, in Japanese Published Patent Application No. 2008-203431. In another exemplary method, a mold including a through hole in communication with the aforementioned cavity is prepared as the aforementioned mold. The opening surface of the cavity of the mold is brought into intimate contact with the upper surface of the under cladding layer. In that state, a photosensitive resin composition, for example, for the formation of the over cladding layer is introduced through the through hole into the cavity, and is then hardened to form the over cladding layer. This technique is disclosed, for example, in Japanese Published Patent Application No. 2008-281654.

In these manufacturing methods, the positioning of the aforementioned mold is generally performed with respect to an alignment mark formed to protrude from the upper surface of the under cladding layer. The alignment mark is generally made of a material for the formation of the cores by a photolithographic method during the formation of the cores. For purposes of improving the positioning accuracy of the mold and reducing tact time, a CCD camera is used to automatically recognize the alignment mark.

However, even when the alignment mark is automatically recognized using a CCD camera so that the positioning of the mold is performed, there are cases where the alignment accuracy of the over cladding layer relative to the cores is lowered and the positioning of the mold is time-consuming. The lowered alignment accuracy of the over cladding layer relative to the cores reduces the intensity of light emitted from the light-emitting section in the over cladding layer. The use of such an optical waveguide as a touch position sensor for a touch panel causes the reduction in sensor performance. Also, the time-consuming positioning of the mold as mentioned above causes the reduction in productivity of optical waveguides.

SUMMARY OF THE INVENTION

It is difficult to automatically recognize the alignment mark by using a CCD camera in some cases. Specifically, the alignment mark is formed in a cylindrical shape by a photolithographic method, for example, as shown in FIG. 6A. The cylindrical alignment mark 8 is photographed with the COD camera from directly above, so that a circular part of a top surface 8a of the cylindrical alignment mark 8 is automatically recognized. When lighting for use during the automatic recognition using the CCD camera is such lighting (from directly above) that a lighting angle is 0 degrees to a peripheral surface 8b of the cylindrical alignment mark 8, such as coaxial overhead illumination, it has been found that an image obtained by the CCD camera shows a blurred contrast between the circular part of the top surface 8a of the cylindrical alignment mark 8 and its surrounding part (an upper surface 1a of an under cladding layer 1), as shown in FIG. 6B. In this case, it has been found that a peripheral edge 8c of the circular part (a boundary line between the circular part and its surrounding part) becomes unclear to result in false recognition and time-consuming recognition, and that the false recognition or the like causes the aforementioned lowering of the alignment accuracy. In this regard, there has been room for improvement. In FIG. 6A, the reference numeral 2 designates cores, and 10 designates a substrate.

A method of manufacturing an optical waveguide is provided which enables a recognition device such as a CCD camera to easily recognize an alignment mark for use during the positioning of a mold when an over cladding layer is formed using the mold.

The method of manufacturing the optical waveguide comprises the steps of: forming protruding cores and a protruding alignment mark on an upper surface of an under cladding layer by a photolithographic method; and positioning a mold for over cladding layer formation by using the alignment mark as a guide to form an over cladding layer. The photolithographic method employs a photomask having an opening pattern for alignment mark formation. The opening pattern includes an opening, and a light transmission amount reduction region provided around the opening and having an aperture ratio within a range greater than 10% and less than 80%. The alignment mark is formed to have a peripheral side surface in the form of an inclined surface resulting from the decrease in the amount of irradiation light transmitted through the light transmission amount reduction region, thereby enhancing the recognizability of the alignment mark with a recognition device.

To enhance the recognizability of the alignment mark for use during the positioning of the mold with a recognition device such as a CCD camera in the method of manufacturing an optical waveguide in which the mold is used for the formation of the over cladding layer, the peripheral side surface of the alignment mark is formed in the form of the inclined surface, based on the foregoing findings. When the photomask having the opening pattern for alignment mark formation including the opening and the light transmission amount reduction region provided around the opening and having the aperture ratio within a range greater than 10% and less than 80% is used for the formation of the alignment mark, part of the alignment mark formed by the irradiation light transmitted through the light transmission amount reduction region is formed as an inclined peripheral side surface, so that the alignment mark has the shape of a truncated cone, for example. The alignment mark having such an inclined peripheral side surface is easily recognizable with the recognition device such as a CCD camera.

Specifically, the irradiation light transmitted through the light transmission amount reduction region of the photomask is reduced in intensity. For this reason, the peripheral side surface of the alignment mark which is formed by the irradiation light with the reduced intensity is formed as the inclined surface. When the aforementioned alignment mark is automatically recognized with the recognition device such as a CCD camera from directly above, an image obtained by the recognition device shows a clear contrast between the inclined portion (the peripheral side surface) of the alignment mark and the horizontal portions (the top surface and the upper surface) of the alignment mark and the under cladding layer, regardless of whether lighting during the automatic recognition is coaxial overhead illumination or illumination at other lighting angles. Thus, the peripheral edge of the alignment mark (a boundary line between the alignment mark and its surrounding part) in the image becomes clear, so that the alignment mark is easily recognized with the recognition device.

In the method of manufacturing an optical waveguide, the photomask having the opening pattern for alignment mark formation including the opening and the light transmission amount reduction region provided around the opening and having the aperture ratio within a range greater than 10% and less than 80% is used for the formation of the protruding alignment mark. This provides the peripheral side surface of the alignment mark in the form of the inclined surface, thereby producing the entire alignment mark in the shape of a truncated cone, for example. Thus, when the alignment mark is recognized with the recognition device such as a CCD camera, a clear contrast is provided between the inclined surface portion of the alignment mark in the shape of the truncated cone and the horizontal portions (the top surface and the upper surface) of the alignment mark and the under cladding layer to facilitate the recognition of the alignment mark. This consequently prevents false recognition of the alignment mark and the time-consuming recognition thereof to achieve the efficient production of an optical waveguide having excellent alignment accuracy of the over cladding layer relative to the cores.

Preferably, the light transmission amount reduction region includes a large number of minute openings spaced at predetermined intervals. In such a case, the aperture ratio in the light transmission amount reduction region is easily set to a predetermined value.

DETAILED DESCRIPTION

Figure 1A:
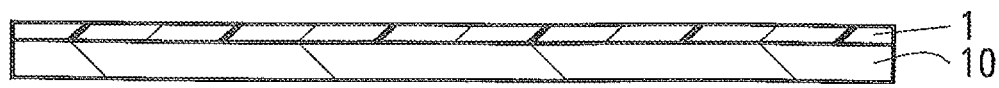
FIGS. 1A to 1C are views schematically illustrating part of a method of manufacturing an optical waveguide according to a first preferred embodiment.

Preferred embodiments according to the present invention will now be described in detail with reference to the drawings.

FIGS. 1A to 1C, 2A and 2B, 3A to 3C, and 4A to 4C show a method of manufacturing an optical waveguide according to a first preferred embodiment. The method of manufacturing an optical waveguide according to the first preferred embodiment will be summarized. First, a photosensitive resin layer 2A for the formation of cores 2 and an alignment mark 3 is formed on the upper surface of an under cladding layer 1 formed on a substrate 10 (with reference to FIGS. 1A and 1B). Next, the cores 2 and the alignment mark 3 are produced (with reference to FIG. 3A) from the photosensitive resin layer 2A by a photolithographic method using a photomask 20 having an opening pattern 22 for core formation and a characteristic opening pattern 23 for alignment mark formation (with reference to FIGS. 1C, 2A and 2B). Next, a coating layer 4A made of a material for the formation of an over cladding layer 4 is formed so as to cover the cores 2 and the alignment mark 3 (with reference to FIG. 3B). Then, a mold 30 is positioned using the alignment mark 3 automatically recognized with a CCD camera and the like as a guide (with reference to FIGS. 3C and 4A). With the mold 30 positioned, the coating layer 4A is pressed into the shape of the over cladding layer 4 by the use of the mold 30 (with reference to FIG. 4B). Thereafter, the mold 30 is removed, so that the over cladding layer 4 is provided (with reference to FIG. 4C). In this manner, an optical waveguide is produced on the substrate 10.

Figure 1B:
Figure 1C:
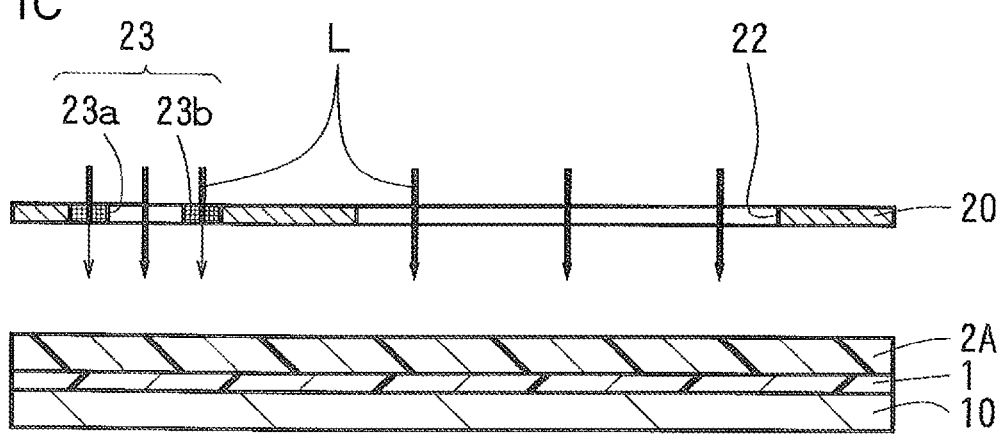
Figure 2A:
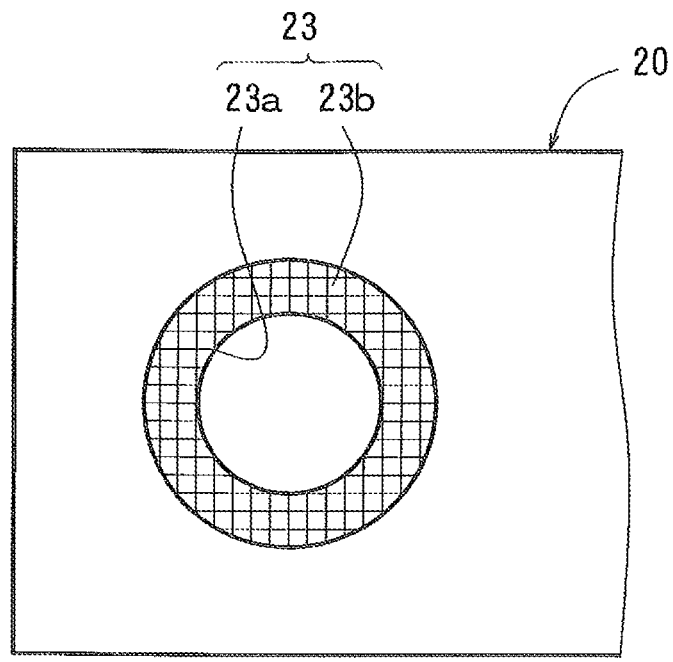
FIG. 2A is a plan view, on an enlarged scale, schematically showing part of a photomask for use in the formation of cores and an alignment mark where the alignment mark is formed.
Figure 2B:
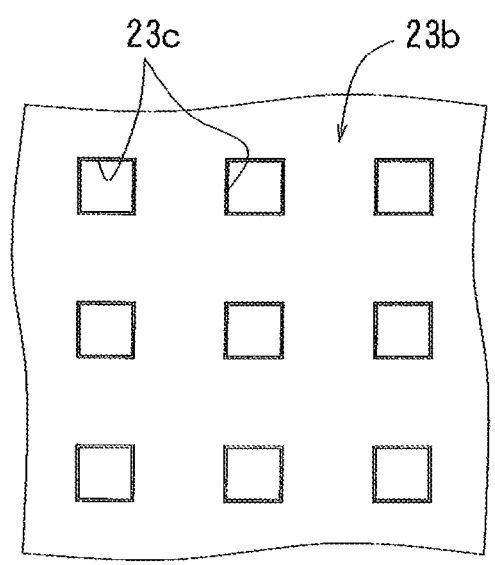
FIG. 2B is a plan view, on an enlarged scale, schematically showing part of a light transmission amount reduction region of FIG. 2A.

The method of manufacturing an optical waveguide is characterized in that the opening pattern 23 for alignment mark formation in the photomask 20 for use in the formation of the alignment mark 3 includes an opening 23a, and a light transmission amount reduction region 23b provided around the opening 23a and having an aperture ratio within a range greater than 10% and less than 80% (with reference to FIGS. 1C, 2A and 2B).

Specifically, the use of the photomask 20 having the characteristic opening pattern 23 for alignment mark formation reduces the intensity of irradiation light L transmitted through the light transmission amount reduction region 23b of the photomask 20 (with reference to FIG. 1C). Part of the alignment mark 3 formed using the irradiation light L reduced in intensity is formed into an inclined peripheral side surface 3b (with reference to FIG. 3A). The formation of the inclined peripheral side surface 3b provides a clear contrast between the inclined surface portion (the peripheral side surface 3b) and horizontal portions (a top surface 3a and the upper surface 1a) of the alignment mark 3 and the under cladding layer 1 during the recognition of the alignment mark 3 with a recognition device such as a CCD camera, thereby enhancing the recognizability of the alignment mark 3 (with reference to FIG. 3C).

Figure 4A:
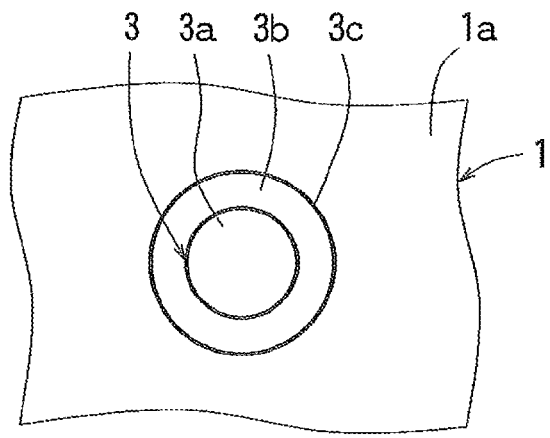
FIG. 4A is a view schematically illustrating an image in which an alignment mark is recognized.

The enhancement of the recognizability of the alignment mark 3 as described above prevents false recognition of the alignment mark 3 to achieve the formation of the over cladding layer 4 in a precise position relative to the cores 2 (with reference to FIG. 4A). The enhancement of the recognizability of the alignment mark 3 as described above also reduces the time required for the positioning of the mold 30, thereby improving the productivity of optical waveguides.

The method of manufacturing an optical waveguide will be described below in detail.

First, the substrate 10 of a flat shape (with reference to FIG. 1A) for use in the formation of the under cladding layer 1 is prepared. Examples of a material for the formation of the substrate 10 include glass, resin such as polyethylene terephthalate (PET) and polyethylene naphthalate (PEN), metal such as stainless steel, quartz, and silicon. The substrate 10 has a thickness in the range of 20 µm to 1.5 mm, for example.

Then, as shown in FIG. 1A, the under cladding layer 1 is formed on the upper surface of the substrate 10. Examples of a material for the formation of the under cladding layer 1 include thermosetting resin compositions and photosensitive resin compositions. When a thermosetting resin composition is used, the thermosetting resin composition is applied to the upper surface of the substrate 10, and the coating layer of the thermosetting resin composition is heated, so that the under cladding layer 1 is formed. When a photosensitive resin composition is used, on the other hand, the photosensitive resin composition is applied to the upper surface of the substrate 10, and the coating layer of the photosensitive resin composition is exposed to irradiation light such as ultraviolet light, so that the under cladding layer 1 is formed. The under cladding layer 1 has a thickness in the range of 5 to 60 µm, for example.

Next, as shown in FIG. 1B, a photosensitive resin composition serving as a material for the formation of the cores 2 and the alignment mark 3 (with reference to FIG. 3A) is applied to the upper surface of the under cladding layer 1 to form the photosensitive resin layer 2A.

Then, as shown in FIG. 1C, the photomask 20 having the opening patterns 22 and 23 corresponding to the patterns of the cores 2 and the alignment mark 3 is placed over the photosensitive resin layer 2A. The photosensitive resin layer 2A is exposed to irradiation light L such as ultraviolet light through the photomask 20.

FIG. 2A is a plan view, on an enlarged scale, of part of the photomask 20. As shown in FIG. 2A, the photomask 20 has the opening pattern 23 for alignment mark formation which includes the opening 23a, and the light transmission amount reduction region 23b provided around the opening 23a and having an aperture ratio within a range greater than 10% and less than 80%, as mentioned above.

In the first preferred embodiment, the opening 23a of the opening pattern 23 for alignment mark formation is of a circular configuration, and the light transmission amount reduction region 23b provided around the opening 23a is of an annular ring-shaped configuration. As shown in FIG. 2B that is a further enlarged plan view, the light transmission amount reduction region 23b according to the first preferred embodiment includes a large number of quadrilateral minute openings 23c spaced at predetermined intervals. In the first preferred embodiment, the aperture ratio in the light transmission amount reduction region 23b is set at a predetermined constant value within the aforementioned range.

Figure 3A:
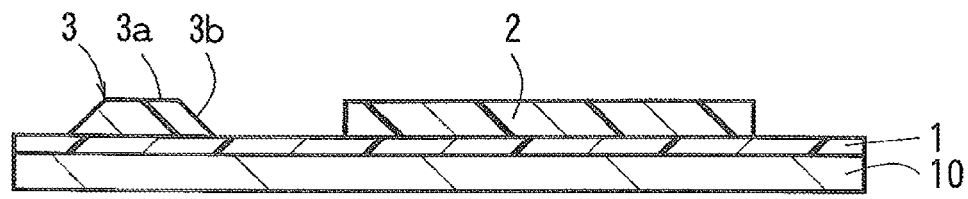
FIGS. 3A to 3C are views schematically illustrating part of the method of manufacturing an optical waveguide subsequent to the steps shown in FIGS. 1A to 1C.

After the exposure to light through the photomask 20 as mentioned above, development is performed using a developing solution to dissolve away unexposed portions of the photosensitive resin layer 2A, thereby forming the remaining part of the photosensitive resin layer 2A into the patterns of the cores 2 and the alignment mark 3, as shown in FIG. 3A. Thereafter, the developing solution remaining on a surface of the remaining part of the photosensitive resin layer 2A and the like is removed by a heating treatment. Thus, the remaining part of the photosensitive resin layer 2A is formed into the cores 2 and the alignment mark 3.

The peripheral side surface 3b of the alignment mark 3 formed in this manner is an inclined surface because the irradiation light L reduced in intensity by being transmitted through the light transmission amount reduction region 23b of the photomask 20 is used for the formation of the peripheral side surface 3b. As a result, the alignment mark 3 is in the shape of a truncated cone.

The light transmission amount reduction region 23b of the photomask 20 includes the large number of minute openings 23c spaced at predetermined intervals as described above to thereby have an aperture ratio within a range greater than 10% and less than 80%. This is because, when the aperture ratio falls outside the aforementioned range, the peripheral side surface 3b of the alignment mark 3 is not formed as the inclined surface, in which case a clear contrast is not obtained in a subsequent step of recognizing the alignment mark 3, so that the recognizability of the alignment mark 3 is not improved.

Figure 3B:
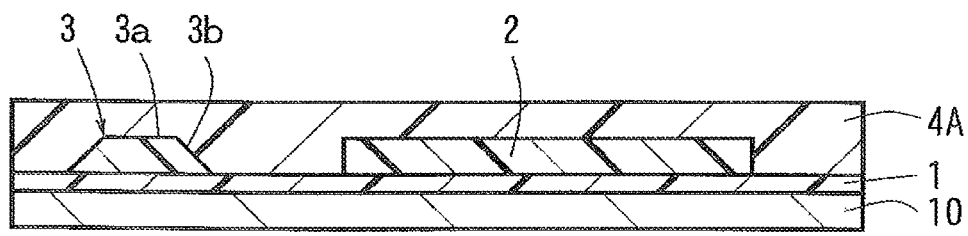

After the cores 2 and the alignment mark 3 are formed in this manner, a resin composition serving as a material for the formation of the over cladding layer 4 is applied so as to cover the cores 2 and the alignment mark 3 to form the coating layer 4A of the resin composition, as shown in FIG. 3B. Examples of the material for the formation of the over cladding layer 4 include thermosetting resin compositions and photosensitive resin compositions similar to those for the under cladding layer 1. The coating layer 4A is permeable to light because it is necessary to automatically recognize the alignment mark 3 through the coating layer 4A with a recognition device such as a CCD camera from directly above in the next step.

Figure 3C:
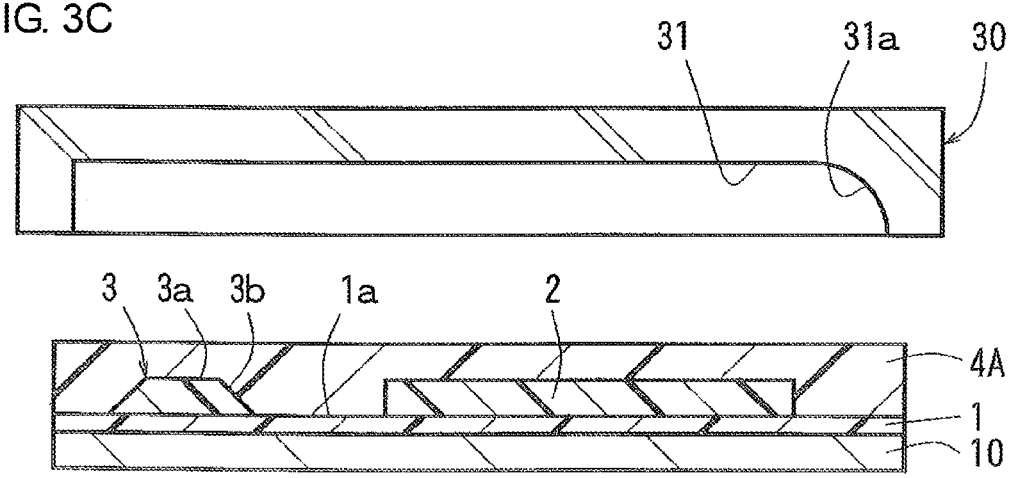

Then, the mold 30 including a cavity 31 having a mold surface complementary in shape to the surface of the over cladding layer 4 is prepared, as shown in FIG. 3C. In the first preferred embodiment, part of the mold surface of the mold 30 corresponding to the tips of the cores 2 is in the form of a curved lens surface 31a. The process of curing the coating layer 4A differs depending on the material for the formation of the over cladding layer 4, which will be described below. Thus, when a photosensitive resin composition is used as the material for the formation of the over cladding layer 4, the mold 30 used herein is made of quartz, for example, which is permeable to light because of the necessity to allow irradiation light for exposure to pass through. When a thermosetting resin composition is used as the material for the formation of the over cladding layer 4, the mold 30 used herein is made of quartz, polymer and metal, for example.

Then, the alignment mark 3 is automatically recognized through the coating layer 4A with a recognition device such as a CCD camera from directly above. The mold 30 is positioned with respect to the position of the automatically recognized alignment mark 3.

In the process of automatic recognition of the alignment mark 3 with a recognition device such as a CCD camera, an image obtained by the recognition device shows a clear contrast between the inclined portion (the peripheral side surface 3b) of the alignment mark 3 and the horizontal portions (the top surface 3a and the upper surface 1a) of the alignment mark 3 and the under cladding layer 1, as shown in FIG. 4A, regardless of whether the lighting during the automatic recognition is coaxial overhead illumination or illumination at other lighting angles. Thus, the peripheral edge 3c of the alignment mark 3 (a boundary line between the alignment mark 3 and its surrounding part) in the image becomes clear, so that the alignment mark 3 is easily recognized with the recognition device.

Figure 4B:
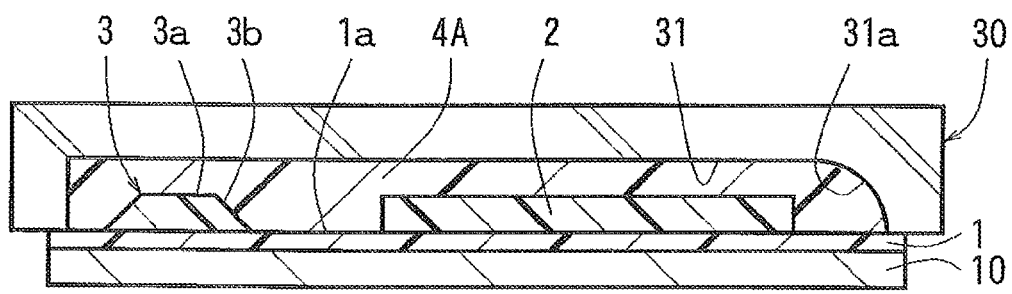
FIGS. 4B and 4C are views schematically illustrating part of the method of manufacturing an optical waveguide subsequent to the steps shown in FIGS. 3A to 3C.

With the mold 30 positioned in the aforementioned manner, the coating layer 4A is pressed into the shape of the over cladding layer 4 by the use of the mold 30, as shown in FIG. 4B. In that state, the molded part of the coating layer 4A is cured to form the over cladding layer 4. The curing of the coating layer 4A is done by heating the coating layer 4A when a thermosetting resin composition is used as the material for the formation of the over cladding layer 4, and is done by exposing the coating layer 4A with irradiation light such as ultraviolet light through the mold 30 when a photosensitive resin composition is used as the material for the formation of the over cladding layer 4.

Figure 4C:
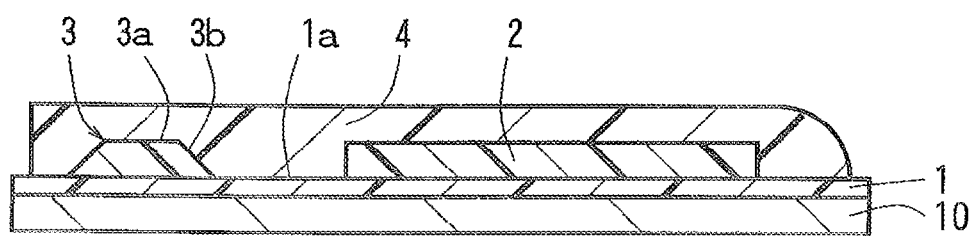

Thereafter, the mold 30 is removed, as shown in FIG. 4C. This provides the over cladding layer 4 properly positioned relative to the cores 2. In this manner, an optical waveguide including the under cladding layer 1, the cores 2, the alignment mark 3 and the over cladding layer 4 is produced on the upper surface of the substrate 10.

In the first preferred embodiment described above, the opening 23a of a circular configuration in the center of the opening pattern 23 for alignment mark formation in the photomask 20 is used to produce the alignment mark 3 in the shape of a truncated cone. However, the opening 23a and the alignment mark 3 may be of other configurations. For example, the opening 23a of a polygonal configuration, such as triangular and quadrilateral configurations, or of a cross-shaped configuration may be used to produce the alignment mark 3 in the shape of a truncated polygonal pyramid, such as truncated triangular and quadrangular pyramids, or in the shape of a truncated cross-shaped pyramid. Also, the large number of minute openings 23c formed in the light transmission amount reduction region 23b around the opening 23a is quadrilateral in shape according to the first preferred embodiment, but may be of other configurations. For example, the minute openings 23c may be of a circular configuration or a polygonal configuration, such as triangular and pentagonal configurations. Further, the aperture ratio in the light transmission amount reduction region 23b is set at a predetermined constant value within a range greater than 10% and less than 80% according to the first preferred embodiment. However, the aperture ratio may be set so as to decrease gradually within the aforementioned range toward the outside of the light transmission amount reduction region 23b.

Figure 5A:
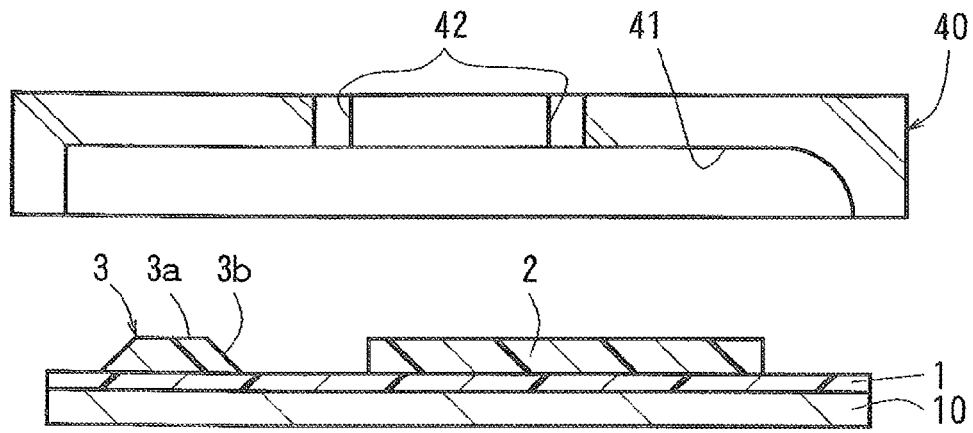
FIGS. 5A to 5C are views schematically illustrating part of a method of manufacturing an optical waveguide according to a second preferred embodiment.
Figure 5B:
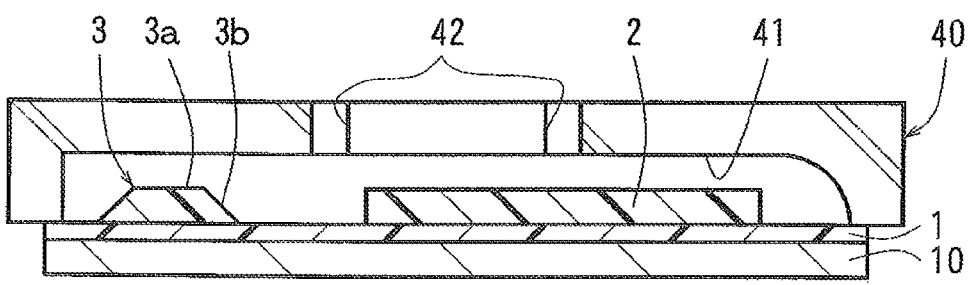
Figure 5C:
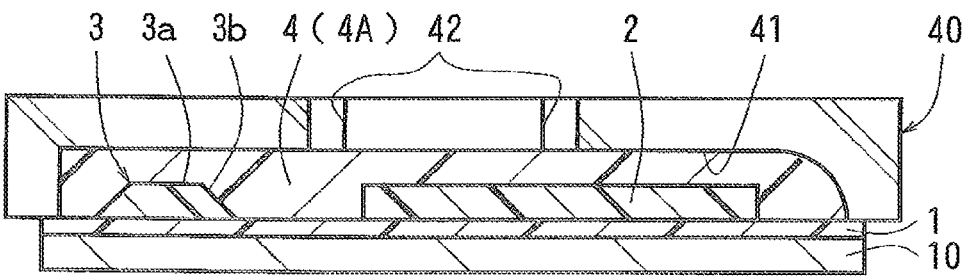
Figure 6A:
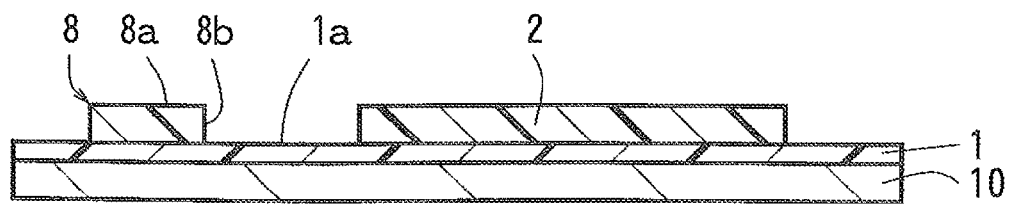
FIG. 6A is a view schematically illustrating the step of forming cores and an alignment mark in a conventional method of manufacturing an optical waveguide.
Figure 6B:
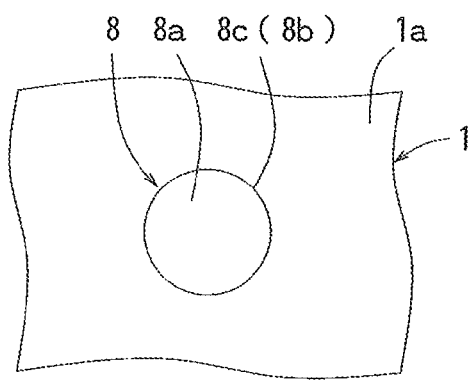
FIG. 6B is a view schematically illustrating an image in which an alignment mark is recognized in the conventional method.

Also, a mold 40 including a cavity 41 in communication with through holes 42 may be used, as shown in FIG. 5A, in place of the mold 30 for over cladding layer formation in the first preferred embodiment. The formation of the over cladding layer 4 by the use of the mold 40 is as follows. As in the first preferred embodiment, the mold 40 is positioned with respect to the position of the alignment mark 3 automatically recognized with a recognition device such as a CCD camera, as shown in FIG. 5B. In this state, the opening surface of the cavity 41 of the mold 40 is brought into intimate contact with the upper surface of the under cladding layer 1. In that state, as shown in FIG. 5C, the material for the formation of the over cladding layer 4 is introduced through the through holes 42 into the cavity 41, and is then cured. This provides the over cladding layer 4.

Next, inventive examples of the present invention will be described in conjunction with comparative examples. It should be noted that the present invention is not limited to the inventive examples.

EXAMPLES

<Material for Formation of Under Cladding Layer>

Component A (solid epoxy resin): 70 parts by weight of an epoxy resin having an aromatic ring skeleton (Epicoat 1002 available from Mitsubishi Chemical Corporation).

Component B (solid epoxy resin): 30 parts by weight of an epoxy resin having an alicyclic skeleton (EHPE 3150 available from Daicel Chemical Industries, Ltd.).

Component C (photo-acid generator): two parts by weight of a 50% propione carbonate solution of a triaryl sulfonium salt (CPI-200K available from San-Apro Ltd.).

A material (a photosensitive resin composition) for the formation of an under cladding layer was prepared by stirring (at a temperature of 80° C. at 250 rpm for three hours) to dissolve these components A to C in 55 parts by weight of ethyl lactate (available from Musashino Chemical Laboratory, Ltd.).

<Material for Formation of Cores>

Component D: 100 parts by weight of O-cresol novolac glycidyl ether (YDCN-700-10 available from Nippon Steel Chemical Co., Ltd.).

A material (a photosensitive resin composition) for the formation of cores was prepared by stirring (at a temperature of 80° C. at 250 rpm for three hours) to dissolve the component D and one part by weight of the aforementioned component C in 60 parts by weight of ethyl lactate (available from Musashino Chemical Laboratory, Ltd.).

Inventive Example 1

<Formation of Under Cladding Layer>

The material for the formation of the under cladding layer was applied to a surface of SUS304 foil (available from Toyo Seihaku Co., Ltd. and having a thickness of 20 μm) with a spin coater (1X-DX2 available from Mikasa Co., Ltd.). Thereafter, a drying process was performed at 130° C. for 10 minutes to form a photosensitive resin layer. Then, an exposure machine (MA-60F available from Mikasa Co., Ltd.) and an ultra-high-pressure mercury-vapor lamp (USH-250D available from Ushio Inc.) were used to irradiate the photosensitive resin layer with ultraviolet light (having a wavelength of 365 nm), thereby exposing the photosensitive resin layer to the ultraviolet light at an integrated dose of 2000 mJ/cm$^2$. Subsequently, a heating treatment was performed at 130° C. for 10 minutes to form the under cladding layer (with reference to FIG. 1A).

<Photomask for Formation of Cores and Alignment Mark>

A photomask having opening patterns corresponding to the patterns of the cores and an alignment mark was prepared. The opening pattern for alignment mark formation included a circular opening having a diameter of 0.6 mm, and an annular ring-shaped light transmission amount reduction region provided around the opening and having an outer diameter of 0.8 mm. The light transmission amount reduction region included a large number of quadrilateral minute openings having dimensions of 3 by 3 μm and spaced at intervals of 7 μm, thereby to have an aperture ratio of 15% (with reference to FIGS. 2A and 2B).

<Formation of Cores and Alignment Mark>

Next, the material for the formation of the cores was applied to the upper surface of the under cladding layer with the aforementioned spin coater. Thereafter, a drying process was performed at 130° C. for five minutes to form a photosensitive resin layer (with reference to FIG. 1B). Then, the aforementioned exposure machine and the aforementioned ultra-high-pressure mercury-vapor lamp were used to irradiate the photosensitive resin layer with ultraviolet light (having a wavelength of 365 nm), thereby exposing the photosensitive resin layer to the ultraviolet light at an integrated dose of 4000 mJ/cm$^2$ (with reference to FIG. 1C). Subsequently, a heating treatment was performed at 130° C. for 15 minutes. Thereafter, development (dip development) was performed by dipping the resulting structure in a developing solution including γ-butyrolactone (available from Mitsubishi Chemical Corporation) for three minutes to dissolve away unexposed portions of the photosensitive resin layer. Thereafter, a heating treatment was performed at 120° C. for 10 minutes to form the cores and the alignment mark on the upper surface of the under cladding layer (with reference to FIG. 3A).

Inventive Example 2

The photomask used in Inventive Example 1 had an opening pattern for alignment mark formation in which a light transmission amount reduction region included a large number of quadrilateral minute openings having dimensions of 7 by 7 μm and spaced at intervals of 11 μm, thereby to have an aperture ratio of 40%. Except for these differences, the cores and the alignment mark in Inventive Example 2 were formed on the upper surface of the under cladding layer in a manner similar to that in Inventive Example 1 described above.

Inventive Example 3

The photomask used in Inventive Example 1 had an opening pattern for alignment mark formation in which a light transmission amount reduction region included a large number of quadrilateral minute openings having dimensions of 10 by 10 μm and spaced at intervals of 13 um, thereby to have an aperture ratio of 60%. Except for these differences, the cores and the alignment mark in Inventive Example 3 were formed on the upper surface of the under cladding layer in a manner similar to that in Inventive Example 1 described above.

Comparative Example 1

The photomask used in Inventive Example 1 had an opening pattern for alignment mark formation in which a light transmission amount reduction region included a large number of quadrilateral minute openings having dimensions of 3 by 3 μm and spaced at intervals of 9 μm, thereby to have an aperture ratio of 10%. Except for these differences, the cores and the alignment mark in Comparative Example 1 were formed on the upper surface of the under cladding layer in a manner similar to that in Inventive Example 1 described above.

Comparative Example 2

The photomask used in Inventive Example 1 had an opening pattern for alignment mark formation in which a light transmission amount reduction region included a large number of quadrilateral minute openings having dimensions of 10 by 10 μm and spaced at intervals of 12 μm, thereby to have an aperture ratio of 80%. Except for these differences, the cores and the alignment mark in Comparative Example 2 were formed on the upper surface of the under cladding layer in a manner similar to that in Inventive Example 1 described above.

<Recognizability of Alignment Mark>

A CCD camera (IV-S210X available from Sharp Manufacturing Systems Corporation) was used to automatically recognize the alignment marks in Inventive Examples 1 to 3 and Comparative Examples 1 and 2. In this process, images obtained by the CCD camera were gray-scale images, and the alignment marks were detected using a circular search area having a diameter of 0.6 mm. As a result, alignment marks that were automatically recognized within one second were evaluated as being "good" and indicated by open circles in Table 1 below, and alignment marks that were not automatically recognized after five seconds were evaluated as being "unacceptable" and indicated by crosses in Table 1 below.

TABLE 1

|  | Inv. Ex. | | | Comp. Ex. | |
| --- | --- | --- | --- | --- | --- |
|  | 1 | 2 | 3 | 1 | 2 |
| Aperture Ratio (%) | 15 | 40 | 60 | 10 | 80 |
| Recognizability | ○ | ○ | ○ | x | x |

The results given in Table 1 show that the alignment marks in Inventive Examples 1 to 3 each formed using the photomask having the opening pattern for alignment mark formation in which the light transmission amount reduction region has an aperture ratio within a range greater than 10% and less than 80% are high in recognizability with the CCD camera, as compared with the alignment marks in Comparative Examples 1 and 2 each formed using the photomask in which the light transmission amount reduction region has an aperture ratio falling outside the aforementioned range.

When the alignment marks in Inventive Examples 1 to 3 and in Comparative Examples 1 and 2 were observed under a microscope, the alignment marks in Inventive Examples 1 to 3 were in the shape of a truncated cone, whereas the alignment marks in Comparative Examples 1 and 2 were of a generally cylindrical configuration.

Results similar to those described above were produced when the configuration of the opening of the opening pattern for alignment mark formation in each of the photomasks was changed to a triangular configuration, a quadrilateral configuration and a cross-shaped configuration to produce the alignment mark in the shape of a truncated triangular pyramid, a truncated quadrangular pyramid and a truncated cross-shaped pyramid.

Further, results similar to those described above were produced when the alignment mark was formed with various configurations and sizes of the minute openings formed in the light transmission amount reduction region. The results showed that the recognizability of the alignment mark with the CCD camera was not influenced by variations in the configuration and size of the minute openings when the aperture ratio remained the same.

The method of manufacturing an optical waveguide is applicable to instances where the over cladding layer is formed by positioning the mold with respect to the alignment mark.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A method of manufacturing an optical waveguide, comprising:

forming protruding cores and a protruding alignment mark on an upper surface of an under cladding layer from a photosensitive resin layer by a photolithographic method using a single photomask; and after removing the photomask, positioning a mold for over cladding layer formation by using the alignment mark as a guide to form an over cladding layer, wherein the photolithographic method employs a photomask having opening patterns for core formation and alignment mark formation, wherein the opening pattern for alignment mark formation includes a central first opening and a light transmission amount reduction region provided around the first opening and having an aperture ratio within a range greater than 10% and less than 80%, wherein the light transmission amount reduction region includes a plurality of polygonal or circular second openings which are smaller than the first opening in size and are spaced at predetermined intervals so that the second openings are discrete openings, wherein the protruding alignment mark is formed from a portion of the photosensitive resin layer corresponding to the opening pattern for alignment mark formation including the first opening and the light transmission amount reduction region, wherein the alignment mark has a top surface formed into a horizontal surface by using an irradiation light transmitted through the first opening, wherein the alignment mark has a peripheral side surface in the form of an inclined surface having a height becoming gradually lower toward the outside of the alignment mark resulting from the decrease in the amount of irradiation light transmitted through the light transmission amount reduction region, thereby enhancing the recognizability of the alignment mark with a recognition device, wherein the mold for over cladding layer formation includes a cavity having a mold surface complementary in shape to a surface of the over cladding layer, and wherein, after enhancing the recognizability of the alignment mark, the mold is positioned while the alignment mark and the cores are covered by the cavity of the mold.

2. The method according to claim 1, wherein the alignment mark is in the shape of a truncated cone or a truncated pyramid.

3. The method according to claim 1, wherein the aperture ratio in the light transmission amount reduction region is set to decrease gradually toward the outside of the light transmission amount reduction region.

* * * * *